United States Patent
Hammi (10) Patent No.: US 9,337,781 B2
(45) Date of Patent: May 10, 2016

(54) AUGMENTED TWIN NONLINEAR TWO-BOX MODELING AND PREDISTORTION METHOD FOR POWER AMPLIFIERS AND TRANSMITTERS

(71) Applicant: KING FAHD UNIVERSITY OF PETROLEUM AND MINERALS, Dhahran (SA)

(72) Inventor: Oualid Hammi, Dhahran (SA)

(73) Assignee: KING FAHD UNIVERSITY OF PETROLEUM AND MINERALS, Dhahran (SA)

( * ) Notice: Subject to any disclaimer, the term of this patent is extended or adjusted under 35 U.S.C. 154(b) by 59 days.

(21) Appl. No.: 14/101,256

(22) Filed: Dec. 9, 2013

(65) Prior Publication Data
US 2015/0162881 A1  Jun. 11, 2015

(51) Int. Cl.
| | |
|---|---|
| H03F 3/21 | (2006.01) |
| H03F 3/19 | (2006.01) |
| H03F 1/26 | (2006.01) |
| H03F 1/32 | (2006.01) |
| H03F 3/189 | (2006.01) |
| H03F 3/24 | (2006.01) |

(52) U.S. Cl.
CPC ............ *H03F 1/3247* (2013.01); *H03F 1/3258* (2013.01); *H03F 3/189* (2013.01); *H03F 3/24* (2013.01); *H03F 2200/451* (2013.01); *H03F 2201/3209* (2013.01); *H03F 2201/3212* (2013.01); *H03F 2201/3224* (2013.01); *H03F 2201/3233* (2013.01)

(58) Field of Classification Search
USPC ................. 330/149; 375/296–297; 455/114.3
See application file for complete search history.

(56) References Cited

U.S. PATENT DOCUMENTS

| | | | |
|---|---|---|---|
| 7,336,725 B2 | 2/2008 | Cova et al. | |
| 7,366,252 B2 | 4/2008 | Cova et al. | |
| 7,769,103 B2 | 8/2010 | Carichner et al. | |
| 7,847,631 B2 | 12/2010 | Jiang et al. | |
| 7,924,942 B2 | 4/2011 | Rexberg | |
| 8,369,447 B2 | 2/2013 | Fuller et al. | |
| 8,989,307 B2 * | 3/2015 | Zhou et al. | ..... 375/297 |

OTHER PUBLICATIONS

Ghannouchi, F.M., Taringou, F., Hammi, O:, "A dual branch Hammerstein-Wiener architecture for behavior modeling of wideband RF transmitters," Microwave Symposium Digest (MTT), IEEE, pp. 1692-1695, May 23-28, 2010.

(Continued)

*Primary Examiner* — Hieu Nguyen
(74) *Attorney, Agent, or Firm* — Richard C. Litman (57) ABSTRACT

The augmented twin nonlinear two-box modeling and predistortion method for power amplifiers and transmitters provides power amplifier distortion modeling and predistortion linearization. A memoryless nonlinearity is combined with a memory polynomial function that includes cross-terms. The method can utilize an augmented forward twin-nonlinear two-box model, an augmented reverse twin-nonlinear two-box model, or alternatively, an augmented parallel twin-nonlinear two-box model. The present two-box models are validated in modeling and predistortion applications. Measurement results demonstrate the superiority of the present two-box models with respect to conventional state of the art models. The present two-box models lead to better accuracy with reduced complexity.

6 Claims, 9 Drawing Sheets

(56) References Cited

OTHER PUBLICATIONS

Younes, M., Hammi, O., Kwan, A., Ghannouchi, F. M., "An Accurate Complexity-Reduced "PLUME" Model for Behavioral Modeling and Digital Predistortion of RF Power Amplifiers," Transactions on Industrial Electronics, IEEE, vol. 58, No. 4, pp. 1397-1405, Apr. 2011.

Hammi O., Ghannouchi F.M., "Twin nonlinear two-box models for power amplifiers and transmitters exhibiting memory effects with application to digital predistortion", Microwave and Wireless Components Letters, IEEE, vol. 19, No. 8, pp. 530-532, Aug. 2009.

S. Farsi et al. "Cross-Memory Polynomial Modeling for RF Circuits", Microwave Integrated Circuits Conference (EuMIC), Oct. 2012, pp. 262-265.

\* cited by examiner

AUGMENTED TWIN NONLINEAR TWO-BOX MODELING AND PREDISTORTION METHOD FOR POWER AMPLIFIERS AND TRANSMITTERS

BACKGROUND OF THE INVENTION

1. Field of the Invention

The present invention relates to power amplifier circuits and radio frequency transmitter systems, and particularly to an augmented twin nonlinear two-box modeling and predistortion method for power amplifiers and transmitters that provides predistortion suitable for highly nonlinear power amplifiers and transmitters having memory effects.

2. Description of the Related Art

Energy efficient wireless communication systems are being sought as part of the global concern for greener communication systems. Most of the energy savings can be made at the network level, as well as on the base station side. In this context, improving the efficiency of the radio frequency (RF) power amplifier (PA) is perceived as a highly attractive alternative that can enable higher efficiency transmitters and greener communication systems. Amplifiers with efficiency figures in the 70% to 80% range are being designed, although their use for wireless communication applications and their field adoption are still conditional on their ability to meet the linearity requirements of wireless communication standards. Indeed, achieving high efficiency amplification comes at the expense of severely nonlinear behavior due to the inherent efficiency-linearity dilemma in power amplifiers. Since linearity is a must, power efficient amplification circuits are always used together with a linearization technique that allows for mitigating nonlinear distortions of power amplifiers operating in their power efficient nonlinear region. For modern base station applications, baseband digital predistortion technique is the preferred linearization method, since it allows for acceptable linearity levels with a continuously increasing modulation bandwidth capability. One major advantage of baseband digital predistortion is its high flexibility and reconfigurability due to the digital implementation of the predistortion function and the availability of a wide range of digital processing functions that can compensate for static and dynamic distortions.

With the large adoption of baseband digital predistortion-based linearizers, behavioral modeling of RF power amplifiers and transmitters has received increasing interest, mainly motivated by the need to accurately predict their nonlinear behavior for system level simulations, and especially because predistortion can be perceived as a reverse behavioral modeling problem. A large variety of single-box and two-box structures have been reported for the modeling and predistortion of RF power amplifiers and transmitters. Single-box models range from the comprehensive and computationally heavy Volterra series to the compact memory polynomial model and its variants, such as the envelope memory polynomial, the orthogonal memory polynomial, the hybrid memory polynomial-envelope memory polynomial, the generalized memory polynomial model, and the like. Single-box models often result in a large number of coefficients when used for highly nonlinear RF power amplifiers and transmitters driven by multi-carrier wideband signals. In such cases, two-box models appear as a valuable alternative to maintain modeling performance, while requiring a lower number of model coefficients. Popular two-box structures include the Wiener, Hammerstein and their augmented versions, and the twin-nonlinear two-box models.

In modern applications, gallium nitride (GaN) based Doherty power amplifiers are used with multi-carrier wideband long term evolution (LTE) signals. GaN transistors offer superior performance compared to their laterally diffused metal oxide semiconductor (LDMOS) counterparts. However, they typically result in stronger memory effects. These effects get even stronger when advanced amplifier circuits, such as Doherty amplifiers with harmonically tuned carrier and peaking amplifiers, are used. Such a combination of device under test (GaN based high efficiency amplifiers) and operating conditions (multi-carrier LTE drive signals) requires the development of advanced behavioral models. These models are expected to either outperform state-of-the-art existing models, while requiring a comparable number of coefficients, or to achieve similar performance as their state-of-the-art counterparts, while requiring a lower number of coefficients.

Thus, an augmented twin nonlinear two-box modeling and predistortion method for power amplifiers and transmitters solving the aforementioned problems is desired.

SUMMARY OF THE INVENTION

The augmented twin nonlinear two-box modeling and predistortion method for power amplifiers and transmitters combines a memoryless nonlinearity function and a memory polynomial function that includes cross-terms. A first embodiment includes an augmented forward twin-nonlinear two-box model. A second embodiment includes an augmented reverse twin-nonlinear two-box model, and a third embodiment includes an augmented parallel twin-nonlinear two-box model. The present two-box models are validated in modeling and predistortion applications. Measurement results demonstrate the superiority of the present two-box models with respect to conventional state-of-the-art models. The present two-box models lead to better accuracy with reduced complexity.

These and other features of the present invention will become readily apparent upon further review of the following specification and drawings.

BRIEF DESCRIPTION OF THE DRAWINGS

Similar reference characters denote corresponding features consistently throughout the attached drawings.

DETAILED DESCRIPTION OF THE PREFERRED EMBODIMENTS

At the outset, it should be understood by one of ordinary skill in the art that embodiments of the present system can comprise software or firmware code executing on a computer, a microcontroller, a microprocessor, programmable gate array, or a DSP processor; state machines implemented in application specific or programmable logic; or numerous other forms without departing from the spirit and scope of the present method. The present system can be provided as a computer program, which includes a non-transitory machine-readable medium having stored thereon instructions that can be used to program a computer (or other electronic devices) to perform a process according to the process described herein. The machine-readable medium can include, but is not limited to, floppy diskettes, optical disks, CD-ROMs, and magneto-optical disks, ROMs, RAMs, EPROMs, EEPROMs, magnetic or optical cards, flash memory, or other type of media or machine-readable medium suitable for storing electronic instructions.

The augmented twin nonlinear two-box modeling and predistortion method for power amplifiers and transmitters combines a memoryless nonlinearity function and a memory polynomial function that includes cross-terms. A first embodiment includes an augmented forward twin-nonlinear two-box model. A second embodiment includes an augmented reverse twin-nonlinear two-box model, and a third embodiment includes an augmented parallel twin-nonlinear two-box model. The present two-box models are validated in modeling and predistortion applications. Measurement results demonstrate the superiority of the present two-box models with respect to conventional state-of-the-art models. The present two-box models lead to better accuracy with reduced complexity.

To enable accurate modeling and compensation of highly nonlinear static and dynamic distortions generated by high efficiency power amplification circuits driven by wideband signals, the present models use a combination of a strongly nonlinear static function and a mildly nonlinear dynamic distortions function. The static nonlinear function can be implemented using a look-up table (LUT) or a memoryless polynomial function. Details of exemplary LUT construction and a method of populating the table that could be used for implementation of the present LUT are included in U.S. Pat. No. 7,847,631, issued on Dec. 7, 2010 to Jiang et al., which is hereby incorporated by reference in its entirety, but particularly with respect to FIG. 3 and the discussion at col. 4, lines 36-65 regarding the usual structure of an LUT embodying a polynomial function without memory effect. The nonlinear dynamic distortions are modeled by a memory polynomial function with cross-terms. The separation of the static and dynamic distortions allows for the use of a reduced nonlinearity order in the memory polynomial function, which will result in a lower number of coefficients than conventional single-box models. The use of dynamic, nonlinear cross-terms improves the capability of the memory polynomial function in mimicking the dynamic behavior of the device under test (DUT) compared to conventional twin-nonlinear two-box models.

In the models disclosed herein, the memory polynomial function with cross-terms may be implemented according to the following equation:

$$x_{out\_Poly}(n) = \sum_{j=0}^{M_1}\sum_{i=1}^{N_1} a_{ij} \cdot x_{in\_Poly}(n-j) \cdot |x_{in\_Poly}(n-j)|^{i-1} + \\ \sum_{j=0}^{M_2}\sum_{i=2}^{N_2}\sum_{l=1}^{L_2} b_{ij} \cdot x_{in\_Poly}(n-j) \cdot |x_{in\_Poly}(n-j-l)|^{i-1} + \\ \sum_{j=0}^{M_3}\sum_{i=2}^{N_3}\sum_{l=1}^{L_3} c_{ijl} \cdot x_{in\_Poly}(n-j) \cdot |x_{in\_Poly}(n-j+l)|^{i-1} \quad (1)$$

where $x_{in\_Poly}$, and $x_{out\_Poly}$ are the input and output baseband waveforms of the memory polynomial function, respectively.

$N_1$, $N_2$ and $N_3$ are the nonlinearity orders of the aligned, lagging, and leading terms, respectively, $M_1$, $M_2$ and $M_3$ represent the memory depths of the aligned, lagging, and leading polynomial functions, respectively. $L_2$, and $L_3$ represent the lagging and leading cross-terms orders, respectively, and $a_{ij}$, $b_{ijl}$, and $c_{ijl}$ are the coefficients of the aligned, lagging, and leading polynomial functions, respectively.

In the experimental validation, the nonlinearity orders and the memory depths of the aligned, lagging, and leading polynomial functions were set to equal values. Similarly, the number of leading and lagging cross terms used was equal:

$$\begin{cases} N_1 = N_2 = N_3 = N \\ M_1 = M_2 = M_3 = M \\ L_2 = L_3 = L \end{cases} \quad (2)$$

However, in the general case, the nonlinearity orders and memory depths of the polynomial functions, as well as the number of leading and lagging cross-terms, can be optimized independently. This is expected to lead to better trade-off in terms of performance and complexity. The present models contrast with the conventional twin-nonlinear two-box models, where the memory polynomial function is given by the first term of Equation (1), i.e., $$x_{out\_Poly}(n) = \sum_{j=0}^{M_1} \sum_{i=1}^{N_1} a_{ij} \cdot x_{in\_Poly}(n-j) \cdot |x_{in\_Poly}(n-j)|^{i-1} \quad (3)$$

where all the variables are the same as those defined in Equation (1).

Figure 5:
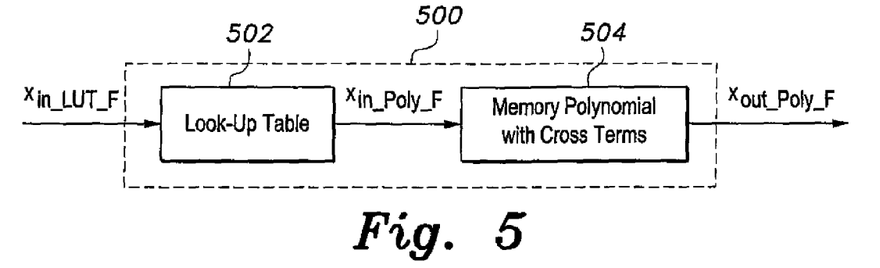
FIG. 5 is a block diagram of the augmented twin nonlinear two-box method for power amplifiers and transmitters modeling and predistortion according to the present invention, showing the forward augmented twin nonlinear two-box model.
Figure 6:
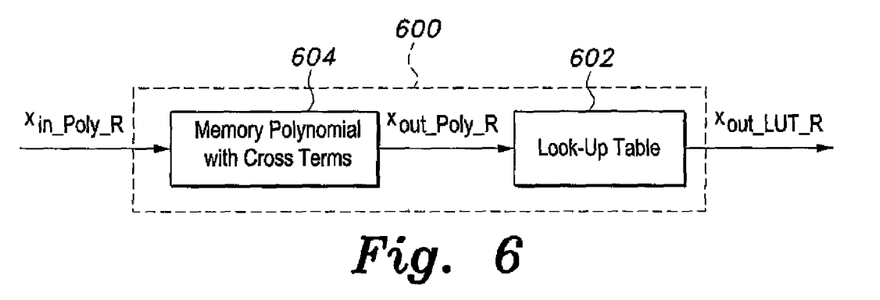
FIG. 6 is a block diagram of the augmented twin nonlinear two-box method for power amplifiers and transmitters modeling and predistortion according to the present invention, showing the reverse augmented twin nonlinear two-box model.
Figure 7:
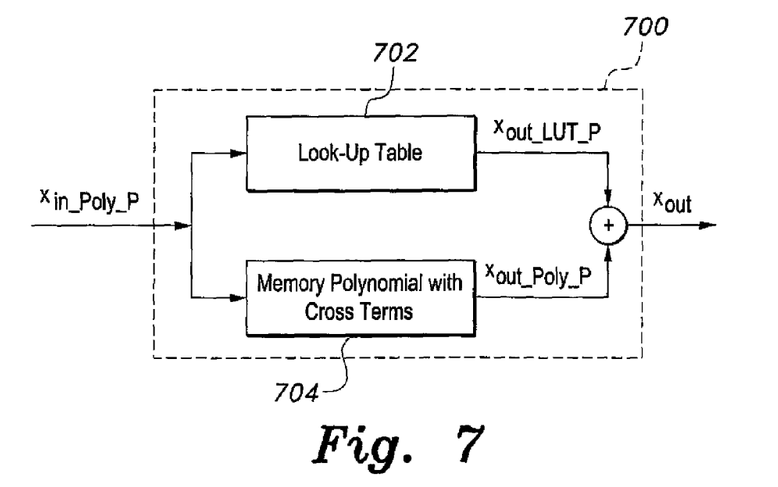
FIG. 7 is a block diagram of the augmented twin nonlinear two-box method for power amplifiers and transmitters modeling and predistortion according to the present invention, showing the parallel augmented twin nonlinear two-box model.

As shown in FIGS. 5-7, the augmented twin-nonlinear two-box behavioral modeling and predistortion methods utilize a system that provides a memoryless nonlinear function, implemented as a look-up table, connected with a dynamic nonlinear function, implemented as a memory polynomial function with cross-terms. The two functions may be connected in cascade or in parallel, depending on the particular embodiment.

Figure 1:
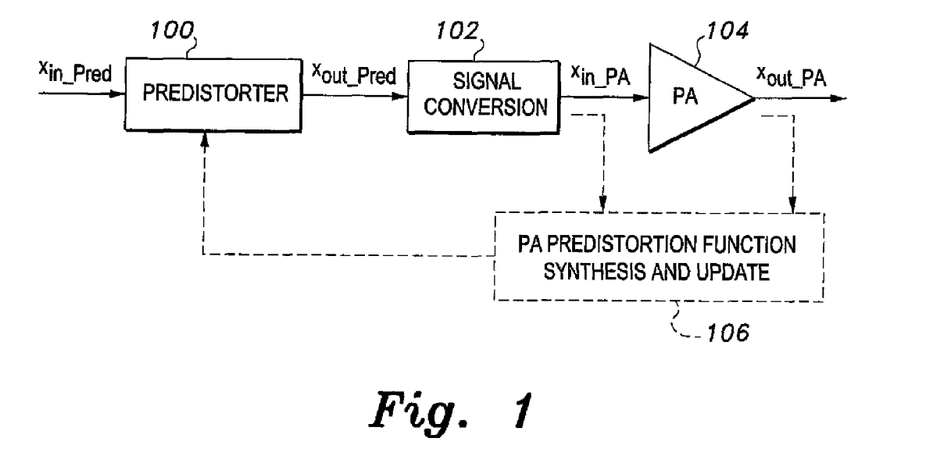
FIG. 1 is a block diagram of a predistortion system using an augmented twin nonlinear two-box modeling and predistortion method for power amplifiers and transmitters according to the present invention.

The conceptual block diagram of a power amplifier predistortion system is presented in FIG. 1. The linearized amplifier system comprises the predistorter 100, which predistorts input signal $x_{in\_Pred}$ and feeds the predistorted signal $x_{out\_Pred}$ to the signal conversion block 102, which performs a signal conversion and feeds the converted signal $x_{in\_PA}$ to the power amplifier 104, which produces the amplified output signal $x_{out\_PA}$. The signal ($x_{in\_Pred}$) is the signal that needs to be transmitted. The input signal ($x_{in\_Pred}$) is fed to the predistorter, which applies a nonlinear function to the input signal. The nonlinear function of the predistorter 100 can be synthesized based on observations of the amplifier's behavior using the PA predistortion function synthesis and update block 106. These observations typically include the acquisition of the amplifier's input and output waveforms to derive its instantaneous input-output relation, or to estimate an error signal that quantifies the linearity performance of the linearized amplifier system. The predistorter signal ($x_{out\_Pred}$) is processed through the signal conversion block 102 to generate the signal to be applied at the input of power amplifier 104. The signal conversion block 102 typically includes such functionalities as digital-to-analog signal conversion, as well as frequency up-conversion and filtering when the predistortion function is applied digitally on the baseband signal.

The signal ($x_{in\_PA}$) at the output of signal conversion block 102 is applied to the amplifier 104 to generate the amplifier's output signal ($x_{out\_PA}$). If the system shown in FIG. 1 is perfectly linear, the signal ($x_{out\_PA}$) at the output of the amplifier will be a scaled replica of the signal ($x_{in\_Pred}$) at the input of predistorter 100. The augmented twin nonlinear two-box models disclosed herein are preferably used within the predistorter block 100.

Figure 2:
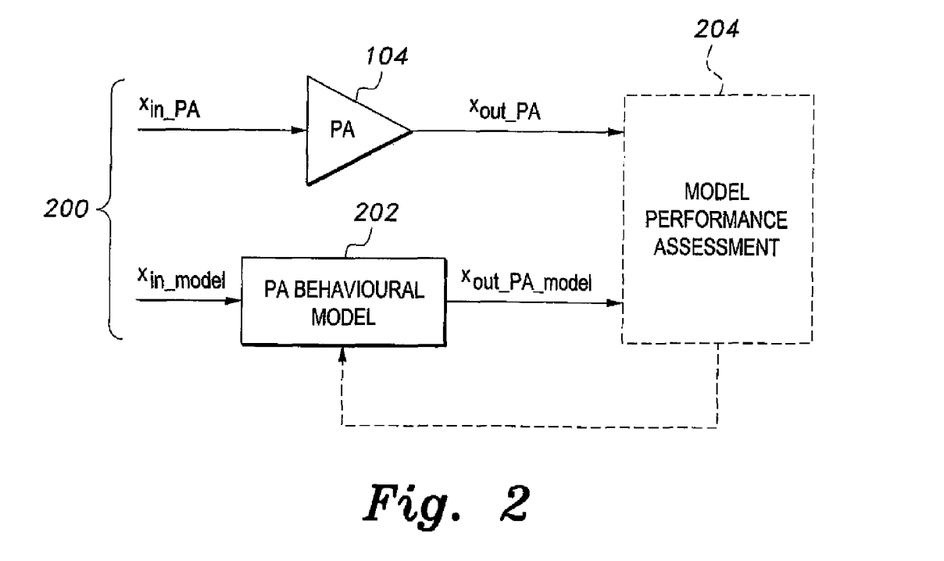
FIG. 2 is a block diagram of a behavioral system that uses an augmented twin nonlinear two-box modeling and predistortion method for power amplifiers and transmitters according to the present invention.

In another embodiment, the structures included in this disclosure can be applied to model the distortions generated by a nonlinear power amplifier. As shown in FIG. 2, the conceptual block diagram 200 uses the present models in a behavioral model 202 for power amplifier 104. When the same input signal is applied to both the behavioral model 202 and the power amplifier 104 (so that $x_{in\_Model} = x_{in\_PA}$), the model's output signal ($x_{out\_PA\_Model}$) should predict as accurately as possible the amplifier's output signal ($x_{out\_PA}$). A model performance assessment block 204 can be included to compare the model's output signal ($x_{out\_PA\_Model}$) and the amplifier's output signal ($x_{out\_PA}$), and if needed, update the coefficients of the PA behavioral model block 202.

Figure 3:
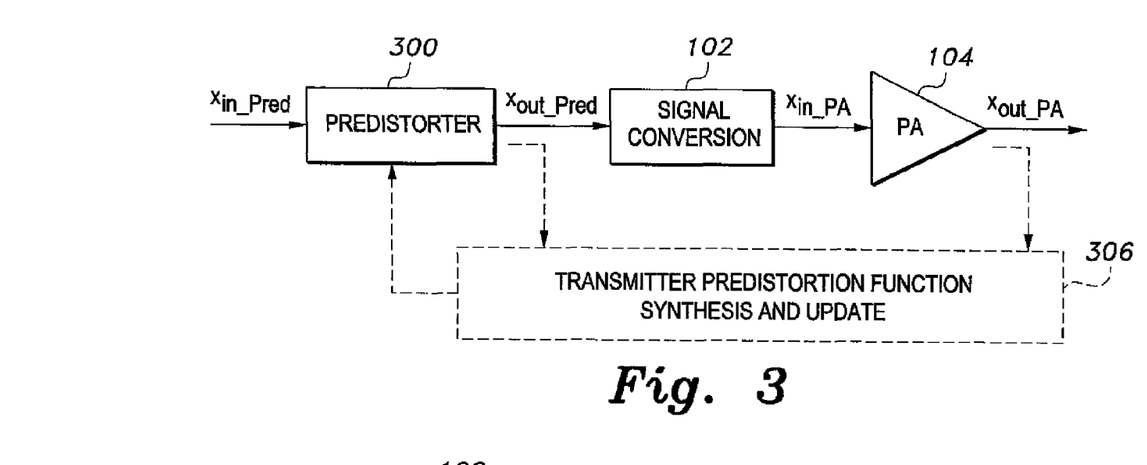
FIG. 3 is a block diagram of a predistortion system using an augmented twin nonlinear two-box modeling and predistortion method for transmitters according to the present invention.

The conceptual block diagram of a transmitter predistortion system is presented in FIG. 3. The linearized transmitter system comprises the predistorter 300, which predistorts input signal $x_{in\_Pred}$ and feeds the predistorted signal $x_{out\_Pred}$ to the signal conversion block 102, which performs a signal conversion and feeds the converted signal $x_{in\_PA}$ to the power amplifier 104, which produces the amplified output signal $x_{out\_PA}$. The signal ($x_{in\_Pred}$) is the is signal that needs to be transmitted. The input signal ($x_{in\_Pred}$) is fed to the predistorter, which applies a nonlinear function to the input signal. The nonlinear function of the predistorter 300 can be synthesized based on observations of the transmitter's behavior using the transmitter predistortion function synthesis and update block 306. These observations typically include the acquisition of the transmitter's input and output waveforms to derive its instantaneous input-output relation, or to estimate an error signal that quantifies the linearity performance of the linearized transmitter system. The predistorter signal ($x_{out\_Pred}$) is processed through the signal conversion block 102 to generate the signal to be applied at the input of power amplifier 104. The signal conversion block 102 typically includes such functionalities as digital-to-analog signal conversion, as well as frequency up-conversion and filtering when the predistortion function is applied digitally on the baseband signal.

The signal ($x_{in\_PA}$) at the output of signal conversion block 102 is applied to the amplifier 104 to generate the amplifier's output signal ($x_{out\_PA}$). If the system shown in FIG. 3 is perfectly linear, the signal ($x_{out\_PA}$) at the output of the amplifier will be a scaled replica of the signal ($x_{in\_Pred}$) at the input of predistorter 300. The augmented twin nonlinear two-box models disclosed herein are preferably used within the predistorter block 300.

Figure 4:
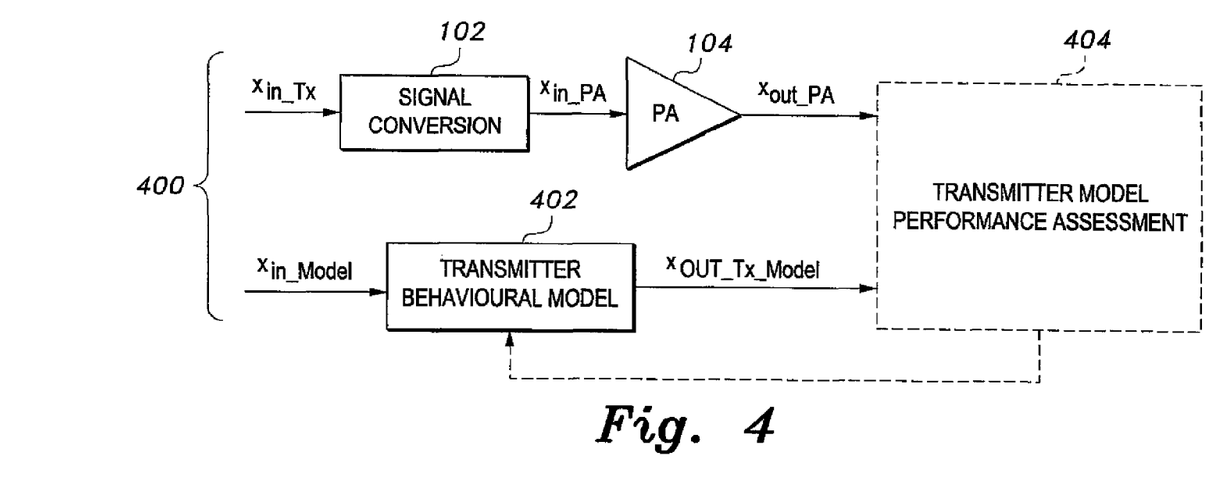
FIG. 4 is a block diagram of a behavioral system that uses an augmented twin nonlinear two-box modeling and predistortion method for transmitters according to the present invention.

In another embodiment, the structures included in this disclosure can be applied to model the distortions generated by a nonlinear transmitter. As shown in FIG. 4, the conceptual block diagram 400 uses the present models in a behavioral model 402 for signal conversion 102 and power amplifier 104 blocks. When the same input signal is applied to both the behavioral model 402 and the signal conversion 102 (so that $x_{in\_Model} = x_{in\_Tx}$), the model's output signal ($x_{out\_Tx\_Model}$) should predict as accurately as possible the amplifier's output signal ($x_{out\_PA}$). A model performance assessment block 404 can be included to compare the model's output signal ($x_{out\_Tx\_Model}$) and the amplifier's output signal ($x_{out\_PA}$), and if needed, update the coefficients of the transmitter behavioral model block 402.

The system structures disclosed herein include an augmented forward twin-nonlinear two-box model where the look-up table (LUT) 502 precedes, and is connected to, the memory polynomial function 504, as shown in FIG. 5. The two-box model 500 can be in the power amplifier's predistorter 100, the transmitter's predistorter 300, the PA behavioral model 202, and the transmitter's behavioral model 402. Conversely, the augmented reverse twin-nonlinear two-box model is obtained when the memory polynomial function 604 is connected upstream of the LUT 602, as shown in FIG. 6. The two-box model 600 can be in the power amplifier's predistorter 100, the transmitter's predistorter 300, the PA behavioral model 202, and the transmitter's behavioral model 402. The augmented parallel twin-nonlinear two-box model is built by connecting the memoryless LUT 702 and a memory polynomial with cross terms block 704 in parallel, as illustrated in FIG. 7. The two-box model can be in the power amplifier's predistorter 100, the transmitter's predistorter 300, the PA behavioral model 202, and the transmitter's behavioral model 402.

Although the models disclosed herein are described in the context of power amplifier nonlinearity modeling and mitigation, it should be understood that they can be applied for the modeling and compensation of any dynamic nonlinear system. The models shown in FIGS. 5, 6, and 7 apply to the amplifier's predistortion unit 100, the transmitter's predistortion unit 300, the PA behavioral model unit 202, and the transmitter's behavioral model unit 402.

Figure 8:
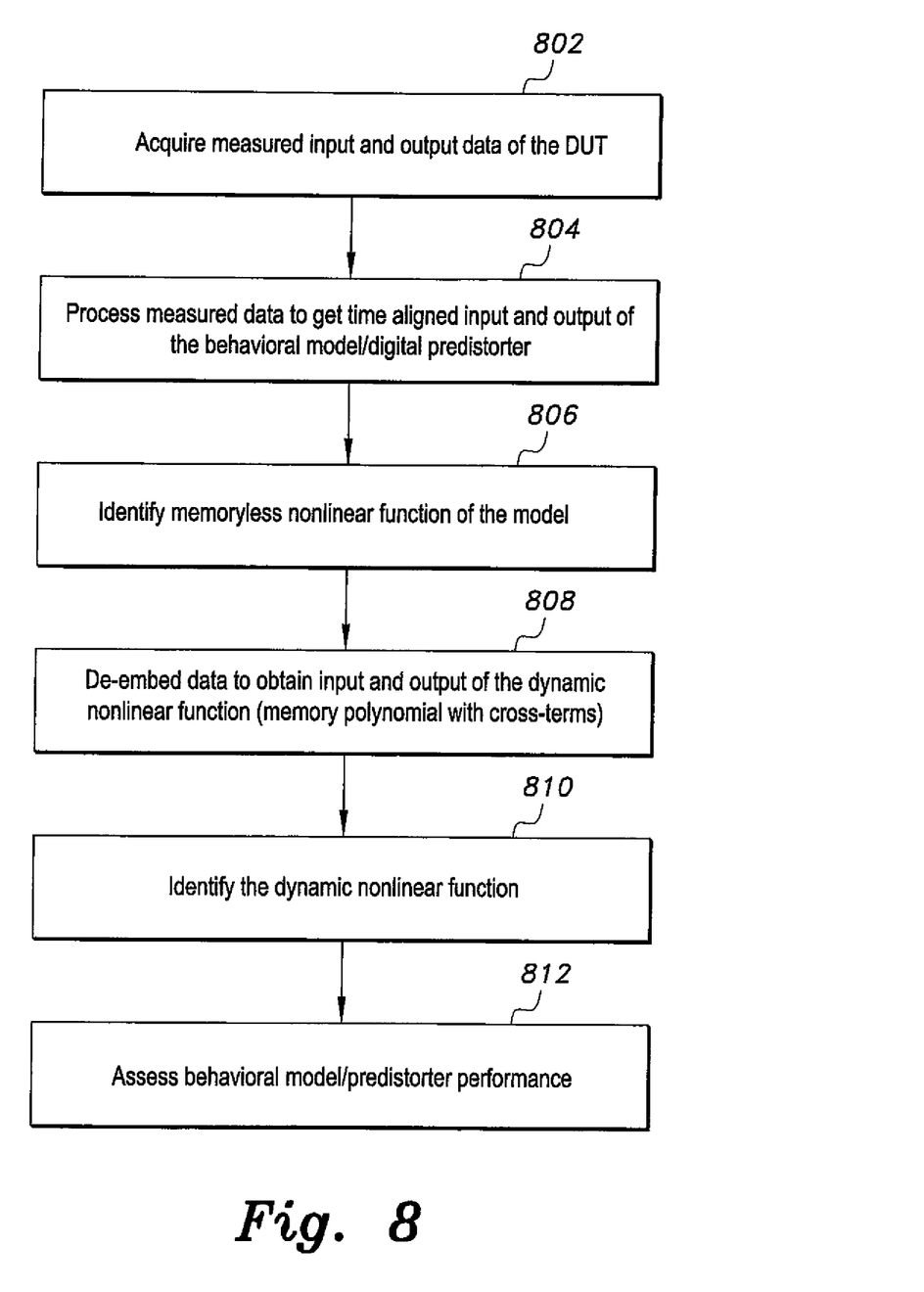
FIG. 8 is a block diagram showing the identification steps of the augmented twin-nonlinear two-box models of FIGS. 5-7 for behavioral modeling and/or predistortion applications.

FIG. 8 shows the flowchart that describes the procedure used to identify the coefficients of the disclosed behavioral models and predistortion methods. The acquired input and output data of the device under test 802 is processed to get the time-aligned, power adjusted input and output waveforms of any of the disclosed two-box functions (namely, the augmented forward twin-nonlinear two-box model 500, the augmented reverse twin nonlinear two-box model 600, and the augmented parallel twin-nonlinear two-box model 700). The processed measurement data 804 is then used in 806 to identify the memoryless nonlinear function of the model. Subsequently, the data at the input and output of the function representing the dynamic nonlinear function are de-embedded 808. The signals obtained in 808 are used to identify the dynamic nonlinear function in step 810. The performance of the two-box behavioral model or predistortion structure obtained at the end of step 810 is validated in step 812.

In this disclosure, augmented twin-nonlinear two-box models are described for the behavioral modeling and predistortion of GaN-based Doherty power amplifiers driven by wideband LTE signals. In order to accurately model the highly nonlinear behavior of the DUT, which includes strong memory effects, the present models use a combination of a memory polynomial model with cross-terms and a memoryless look-up table. The augmented twin-nonlinear two-box models are experimentally validated and their performances benchmarked against those of conventional twin-nonlinear two-box and generalized memory polynomial models.

Experimental results using two power amplifier prototypes clearly illustrate the superiority of the present models, as they can achieve better performance than previously reported models for the same total number of coefficients. Furthermore, compared to the previously reported benchmark models, the disclosed models require a lower number of coefficients for the same performance.

The augmented twin-nonlinear two-box models were applied to model two GaN-based Doherty power amplifiers. The first Doherty amplifier operates around 2425 MHz. This device under test (DUT) was tested using a 4-carrier LTE signal with a carrier configuration of 1001 (where 1 refers to the ON carriers and 0 refers to the OFF carriers) and a total bandwidth of 20 MHz. The second device is also a GaN-based Doherty amplifier. This DUT operates around 2140 MHz and was tested using a single carrier LTE signal having a bandwidth of 20 MHz.

Figure 9A:
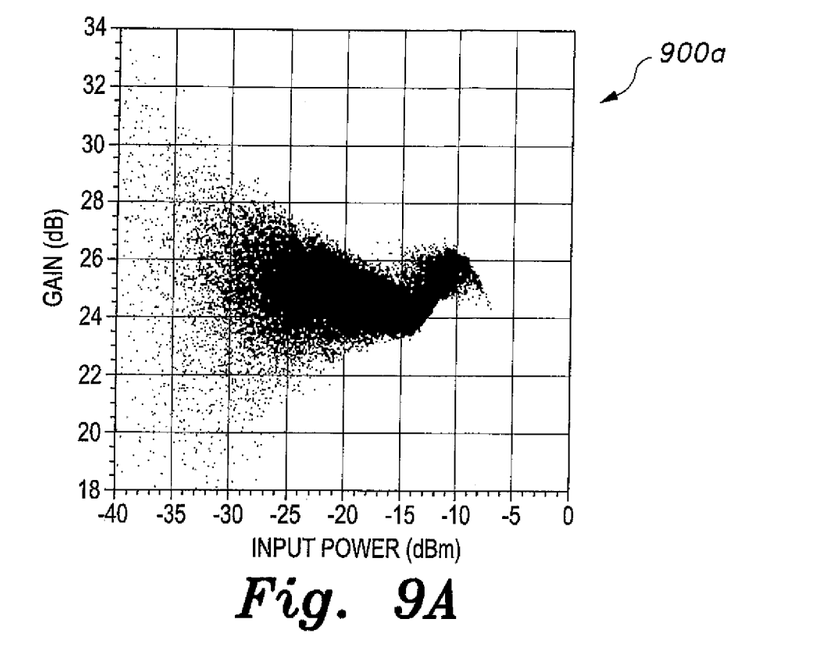
FIG. 9A is a plot showing measured AM/AM characteristics of a sample Doherty PA driven by a 4-carrier LTE signal and operating at a carrier frequency of 2425 MHz.
Figure 9B:
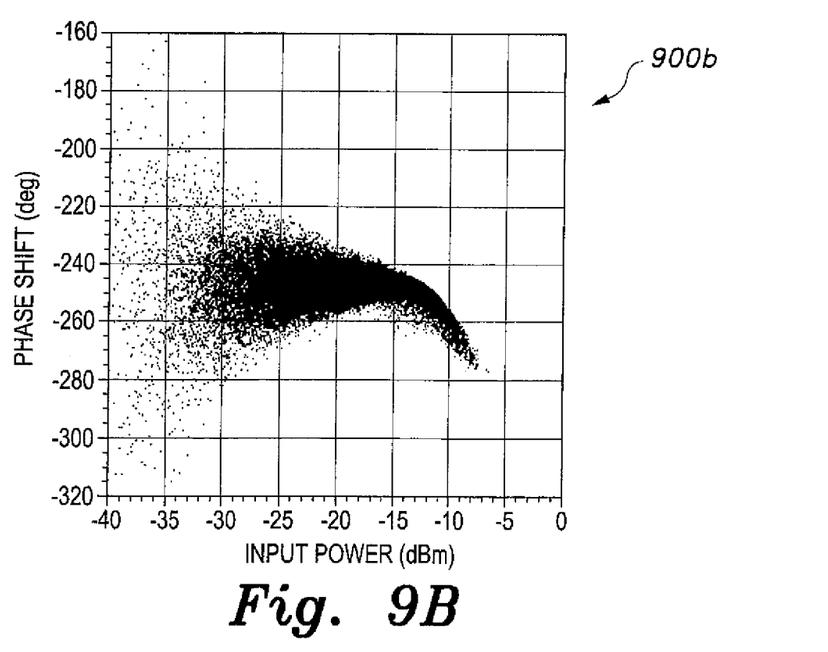
FIG. 9B is a plot showing measured AM/PM characteristics of a sample Doherty PA driven by a 4-carrier LTE signal and operating at a carrier frequency of 2425 MHz.

First, the Doherty amplifiers were characterized by acquiring their input and output baseband complex waveforms. This technique includes using the baseband complex waveform measured at the output of the DUT with a receiver, such as a vector signal analyzer, along with its input counterpart. The measurements were processed to time-align and power-adjust the measured waveforms and then derive the AM/AM and AM/PM characteristics of each amplifier. These characteristics are reported in FIGS. 9A-9B for the 2425 MHz Doherty amplifier, and in FIGS. 10A-10B for the 2140 MHz Doherty amplifier, respectively. Plot 900a of FIG. 9A represents the measured AM/AM characteristic of the 2425 MHz Doherty PA driven by the 4-carrier LTE signal. Plot 900b of FIG. 9B represents the measured AM/PM characteristic of the 2425 MHz Doherty PA driven by the 4-carrier LTE signal.

Figure 10A:
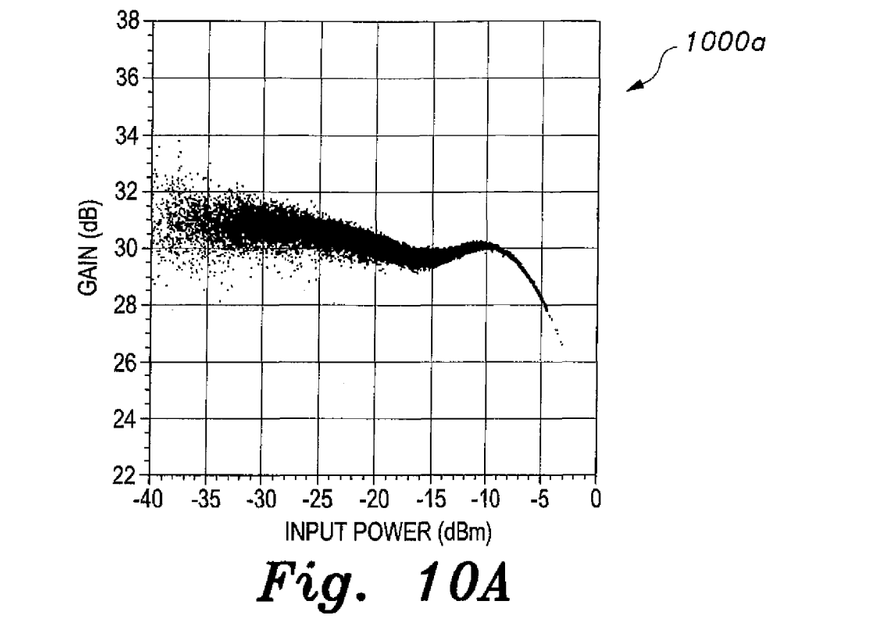
FIG. 10A is a plot showing measured AM/AM characteristics of a sample Doherty PA driven by a 4-carrier LTE signal and operating at a carrier frequency of 2140 MHz.
Figure 10B:
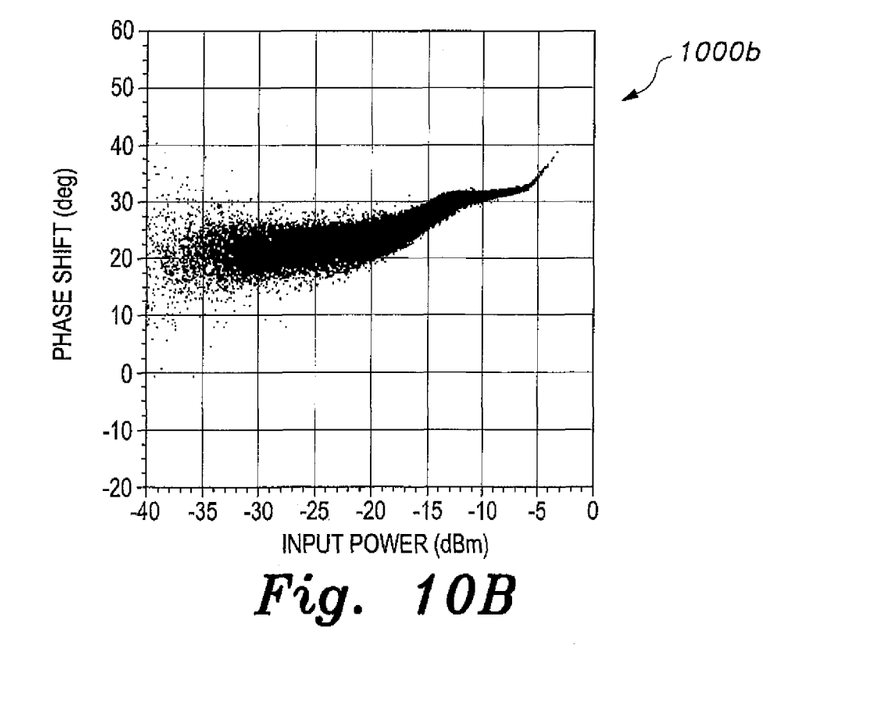
FIG. 10B is a plot showing measured AM/PM characteristics of a sample Doherty PA driven by a 4-carrier LTE signal and operating at a frequency of 2140 MHz.

Plot 1000a of FIG. 10A represents the measured AM/AM characteristic of the 2140 MHz Doherty PA driven by the 4-carrier LTE signal. Plot 1000b of FIG. 10B represents the measured AM/PM characteristic of the 2140 MHz Doherty PA driven by the 4-carrier LTE signal.

According to the AM/AM and AM/PM characteristics, both amplifiers have a strongly nonlinear behavior, mainly due to the Doherty configuration. Comparing the curves reported in FIGS. 9A-9B and 10A-10B shows that a more pronounced dispersion is observed in the case of the 2425 MHz Doherty PA. This can be attributed partly to the nature of the signal with non-contiguous carriers. To quantitatively evaluate the strength of the memory effects of each DUT, the memory effects intensity metric was computed using the memoryless postcompensation technique. The memory effects intensity was calculated using the entire observation bandwidth. The results reported in Table 1 clearly illustrate the importance of the memory effects in the first device under test. Conversely, the memory effects exhibited by the second device under test (the 2140 MHz Doherty PA) are moderate. Accordingly, it is expected that the present models, which enhance the memory effects modeling capabilities, will result in more significant improvement when applied to model the 2425 MHz Doherty PA.

TABLE 1

Memory Effects Intensity of the Device Under Test

| Device Under Test | Memory Effects Intensity | |
|---|---|---|
| | Lower Channel | Upper Channel |
| 2425 MHz Doherty PA | 17.49 dBc | 21.23 dBc |
| 2140 MHz Doherty PA | 42.56 dBc | 41.90 dBc |

Figure 11:
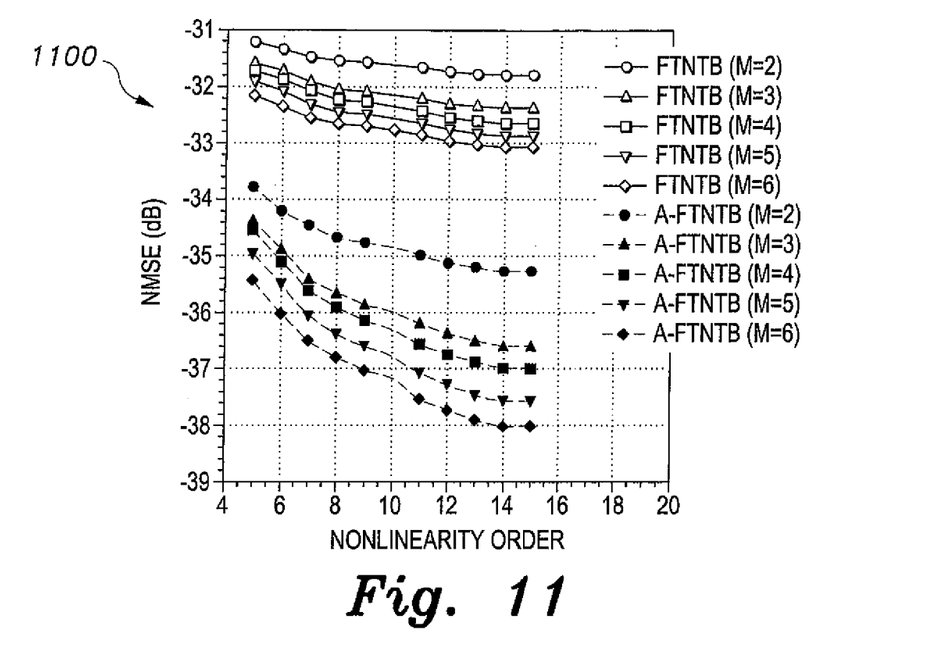
FIG. 11 is a plot showing NMSE (normalized mean-squared error) as a function of nonlinearity order and memory depth of the forward twin-nonlinear two-box model and the augmented forward twin-nonlinear two-box model of FIG. 5.

The augmented forward and reverse twin-nonlinear two-box models were identified for each of the devices under test. For conciseness, thorough results are provided for the 2425 MHz Doherty PA, then a summary of the results obtained for the second DUT is reported. In order to compare the performances of the augmented forward twin-nonlinear two-box (AFTNTB) with that of the forward twin-nonlinear two-box (FTNTB) and evaluate the improvement achieved by including the cross-terms, the LUT sub-function of the FTNTB model was built. Then, the data were de-embedded to the memory polynomial function's input and output planes. The same data were used to identify the memory polynomial function of the FTNTB model and the memory polynomial function with cross-terms of the augmented FTNTB model. First, the FTNTB model was identified using the measured data for a wide set of nonlinearity orders and memory depths. The nonlinearity order ($N_1$) was varied from 5 to 15, and the memory depth ($M_1$) was swept from 2 to 10. For each set of coefficients, the performance of the FTNTB model was evaluated in terms of the normalized mean-squared error (NMSE). Then, the augmented forward twin-nonlinear two-box model was identified for the same ranges of the nonlinearity order and memory depth, and for a leading and lagging cross-terms order ($L_1$) of 1. For each set of coefficients, the performance of the augmented FTNTB model was evaluated in terms of its NMSE. The results are reported in plot 1100 of FIG. 11. For clarity reasons, these results include the NMSE values obtained for a memory depth up to 6. Higher values of memory depths were found to result in marginal NMSE improvement, and are therefore not included in FIG. 11. Plot 1100 demonstrates the performance enhancement obtained with the present model by including first-order cross-terms. Indeed, a 3 dB NMSE improvement is obtained when the augmented forward twin-nonlinear two-box model is used. The performance of both the state-of-the-art model and the present one improves as the nonlinearity order and/or the memory depth of the model increases. However, the present augmented twin-nonlinear two-box model continuously outperforms the conventional one by more than 3 dB when the same nonlinearity order and memory depth are used for both models.

It is important to recall that according to Equations (1) and (3), for a given nonlinearity order and memory depth, the augmented forward twin-nonlinear two-box model has more coefficients than the forward twin-nonlinear two-box model. In fact, the total number of coefficients in the forward twin-nonlinear two-box model and its augmented counterpart are given by Equation (4) and (5), respectively.

$$K_{FTNTB} = T + N_1 \times (M_1+1) \quad (4)$$

and $$K_{AFTNTB} = T + N_1 \times (M_1+1) + (N_2-1) \times (M_2+1) \times L_2 + (N_3-1) \times (M_3+1) \times L_3 \quad (5)$$

where $K_{FTNTB}$ and $K_{AFTNTB}$ are the total number of coefficients (including the LUT sub-function) of the FTNTB and the augmented FTNTB, respectively; T is the size of the look-up table sub-function; and $N_1$, $M_1$, $N_2$, $M_2$, $N_3$, $M_3$, $L_1$, and $L_2$ are those defined for Equation (1).

Since the LUT sub-function is the same for both models, and in order to compare the relative complexity of the FTNTB and the AFTNTB models, the total number of coefficients in the polynomial sub-function is considered. Given that the structures of the two models are similar, their relative complexity is solely a function of the number of coefficients in the memory polynomial function. For the conditions specified by Equation (2), one can find that:

$$P_{FTNTB} = N \times (M+1) \quad (6)$$

$$P_{AFTNTB} = N \times (M+1) + (N-1) \times (M+1) \times (L_2+L_3) \quad (7)$$

where $P_{FTNTB}$ and $P_{AFTNTB}$ are the total number of coefficients in the memory polynomial function of the FTNTB and the AFTNTB, respectively.

Figure 12:
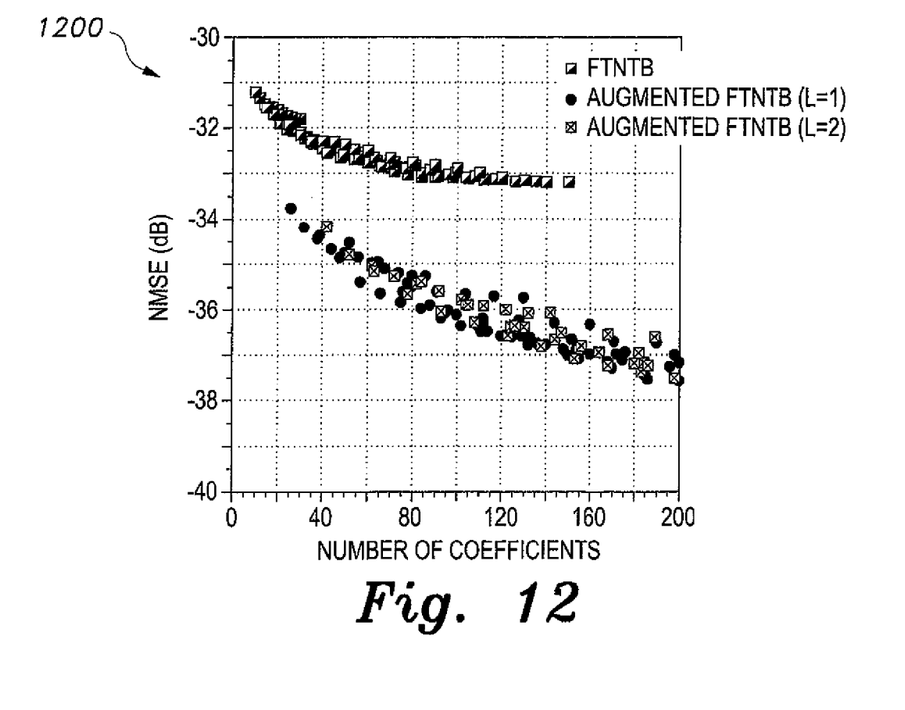
FIG. 12 is a plot showing NMSE (normalized mean-squared error) as a function of number of coefficients of the forward twin-nonlinear two-box model and the augmented forward twin-nonlinear two-box model according to the present invention.

Equation (7) shows that for the same nonlinearity order and memory depth, the total number of coefficients in the augmented FTNTB model is significantly higher than that of the FTNTB one. In order to get a better insight of the relative complexity of the two models, the NMSE is plotted as a function of the polynomial function's number of coefficients for the FTNTB model and the augmented FTNTB model. The results are summarized in plot 1200 of FIG. 12. Here, it is worthwhile mentioning that in behavioral modeling, as well as predistortion, a better model is the one that can lead to the same performance as a benchmark model with less complexity, or better performance than a benchmark model for the same complexity. According to the results of FIG. 12, one can note the superiority of the present model. Indeed, for the same number of coefficients, it achieves an NMSE improvement of approximately 2 to 3 dB. Furthermore, with 26-coefficients in the polynomial function, the FTNTB model leads to an NMSE of −31.7 dB while the augmented FTNTB model has an NMSE of −33.8 dB for the same number of coefficients. This NMSE (−33.8 dB) cannot be obtained with the conventional TNTB model, even when 150 coefficients are used in the polynomial function.

Figure 13:
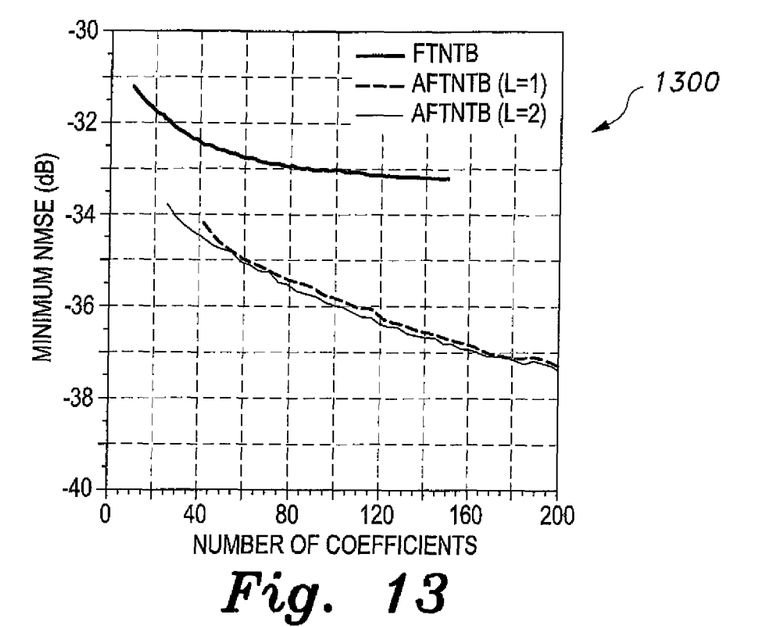
FIG. 13 is a plot showing best NMSE (normalized mean-squared error) performance as a function of number of coefficients of the forward twin-nonlinear two-box model and the augmented forward twin-nonlinear two-box model according to the present invention.

Plot 1300 of FIG. 13 presents a summary of the results obtained for the FTNTB and the augmented FTNTB models when applied to predict the behavior of the 2425 MHz Doherty PA. Plot 1300 reports the minimum NMSE that can be obtained by each model as a function of the number of coefficients used in the memory polynomial function. Thus, FIG. 13 provides a clearer view of the results observed in FIG. 12. Furthermore, it shows that increasing the cross-terms index in the augmented FTNTB model from L=1 to L=2 does not lead to any significant improvement for the same number of coefficients. For a higher number of coefficients, the augmented FTNTB model with L=2 can lead to an NSME as low as −39.1 dB, but with 568 coefficients in the memory polynomial function. Since the main motivation behind the disclosed model is to provide a low complexity, higher accuracy behavioral model and predistortion functions, there is no need, for the considered DUT, to increase the cross-terms index to L=2.

Figure 14:
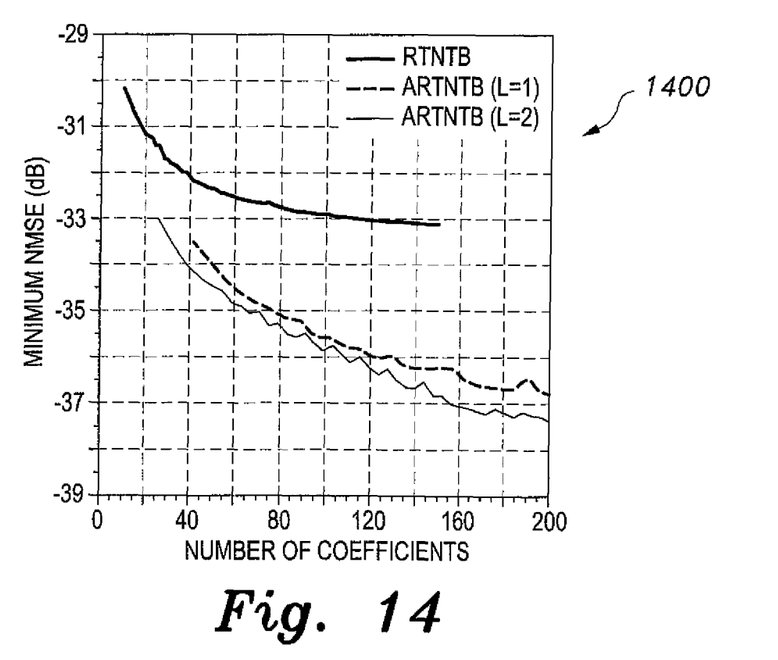
FIG. 14 is a plot showing best NMSE (normalized mean-squared error) performance as a function of number of coefficients of the reverse twin-nonlinear two-box model and the augmented reverse twin-nonlinear two-box model according to the present invention.

The results obtained when the reverse twin-nonlinear two-box (RTNTB) model and the augmented RTNTB model are applied to model the 2425 MHz Doherty PA were derived. The procedure used for the model's identification and performance assessment is that described in FIG. 8. Plot 1400 of FIG. 14 reports the minimum NMSE obtained for the RTNTB and augmented RTNTB models as a function of the number of coefficients in the memory polynomial function. As demonstrated by the results reported in FIG. 14, the augmented RTNTB model outperforms the RTNTB model with approximately 2 dB improvement in the NMSE for the same number of coefficients.

Figure 15:
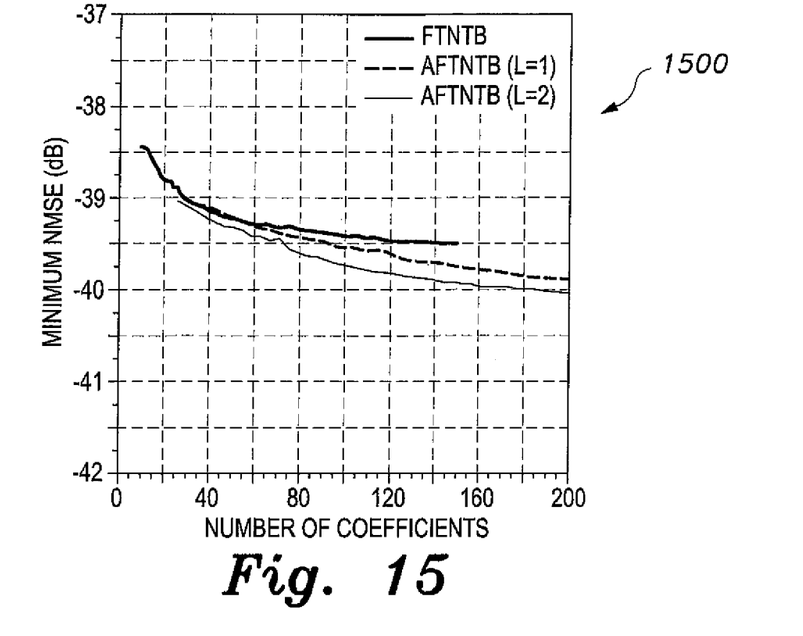
FIG. 15 is a plot showing best NMSE (normalized mean-squared error) performance of the forward twin-nonlinear two-box model and the augmented forward twin-nonlinear two-box model for the modeling of a second device under test (2140 MHz Doherty PA) according to the present invention.

The study described above was performed on the second device under test. For this 2140 MHz Doherty PA, the FTNTB model, augmented FTNTB model, RTNTB model and augmented RTNTB models were derived for various nonlinearity orders and memory depths, and their performances were compared. Plot 1500 of FIG. 15 presents the minimum NMSE obtained for the case of the FTNTB model and the augmented FTNTB model as a function of the number of coefficients in the memory polynomial sub-function. These results illustrate a minor improvement in the NMSE when the augmented FTNTB model is used. Similar results were obtained for the RTNTB and its augmented counterpart. These results are expected, since the second device under test exhibits weaker memory effects than the 2425 MHz Doherty PA, as it can be concluded from the memory effects intensity calculated above. Under such conditions, the twin-nonlinear two-box models and their augmented versions perform similarly. Indeed, the main advantage of the augmented TNTB model is the ability to model strong memory effects for which the conventional TNTB models have limited capabilities.

Figure 16:
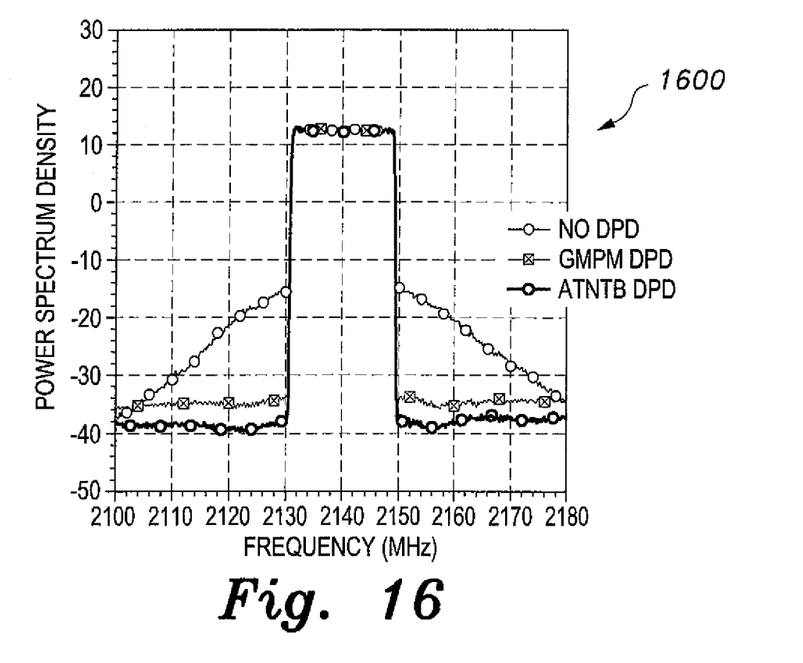
FIG. 16 is a plot showing measured power spectra density at the output of the linearized 2140 MHz Doherty PA for predistorters built using the forward twin-nonlinear two-box model and the augmented forward twin-nonlinear two-box model according to the present invention.

For digital predistortion application, the present models were benchmarked against the generalized memory polynomial model using the 2140 MHz Doherty amplifier. The results reported are for the augmented forward twin nonlinear two-box model. The measured adjacent channel leakage ratio according to the LTE standard are summarized in Table 2, which shows that the present models achieve better performance than the previously reported generalized memory polynomial model. Most importantly, the use of the present predistorter makes it possible to meet the LTE spectrum emission mask, while the state-of-the-art generalized memory polynomial-based digital predistorter fails. The results reported in this table were obtained for 366 coefficients in the generalized memory polynomial and only 139 coefficients in the present ATNTB. This represents a complexity reduction of 62% for better performance. The measured spectra at the output of the amplifier using the generalized memory polynomial model and the augmented TNTB model are reported in plot 1600 of FIG. 16, which corroborates the findings presented in Table 2.

TABLE 2

Measured ACLR performance of the Linearized Amplifier

| Offset Frequency | ATNTB Predistorter | GMPM Predistorter |
|---|---|---|
| −20 MHz | −46.26 dBc | −39.88 dBc |
| +20 MHz | −46.07 dBc | −40.29 dBc |
| −40 MHz | −50.11 dBc | −44.96 dBc |
| +40 MHz | −49.03 dBc | −44.59 dBc |
| Pass/Fail LTE Mask | Pass | Fail |

According to the data analysis presented in the previous section, the present augmented twin-nonlinear two-box behavioral models and digital predistorters can achieve similar and even better performance as state-of-the-art behavioral models and digital predistorters, while requiring significantly fewer coefficients. Moreover, it was demonstrated that, when used for the mitigation of power amplifiers and transmitters distortions, the present models can allow the linearized system to meet the spectrum linearity mask set by communication standards, while conventional predistorters might fail. This makes the new models suitable for use in modern communication systems, where wideband and multi-carrier signals are being transmitted. The present structures combine two highly sought features, which are improved performance and reduced complexity.

It is to be understood that the present invention is not limited to the embodiments described above, but encompasses any and all embodiments within the scope of the following claims.

I claim:

1. A method of predistorting signals using an augmented reverse twin nonlinear two-box model to compensate for a nonlinear power amplifier, comprising the steps of:

accepting an input signal, $x_{in\_Poly\_R}$, the input signal being a digitized signal;

predistorting the input signal, $x_{in\_Poly\_R}$, in accordance with a memory polynomial function including cross terms to produce a first predistorted input signal, $x_{out\_Poly\_R}$, the memory polynomial function being characterized by the relation:

$$x_{out\_Poly\_R}(n) = \sum_{j=0}^{M_1} \sum_{i=1}^{N_1} a_{ij} \cdot x_{in\_Poly\_R}(n-j) \cdot |x_{in\_Poly\_R}(n-j)|^{i-1} +$$

$$\sum_{j=0}^{M_2} \sum_{i=2}^{N_2} \sum_{l=1}^{L_2} b_{ijl} \cdot x_{in\_Poly\_R}(n-j) \cdot |x_{in\_Poly\_R}(n-j-l)|^{i-1} +$$

$$\sum_{j=0}^{M_3} \sum_{i=2}^{N_3} \sum_{l=1}^{L_3} c_{ijl} \cdot x_{in\_Poly\_R}(n-j) \cdot |x_{in\_Poly\_R}(n-j+l)|^{i-1};$$

wherein $x_{in\_Poly\_R}$ and $x_{out\_Poly\_R}$ are input and output waveforms of the output polynomial, respectively, $N_1$, $N_2$, and $N_3$ are the nonlinearity orders of aligned, lagging and leading polynomial function terms, respectively, $M_1$, $M_2$, and $M_3$ represent memory depths of the aligned, lagging and leading polynomial functions, respectively, $L_2$, and $L_3$ represent lagging and leading cross-terms orders, respectively, $a_{ij}$, $b_{ijl}$, and $c_{ijl}$ are the coefficients of the aligned, lagging and leading polynomial functions, respectively; and subsequently predistorting the first predistorted input signal, $x_{out\_Poly\_R}$, using values in a look-up table of values computed from a memoryless polynomial to produce a second predistorted input signal, $x_{out\_LUT\_R}$, for input to the nonlinear power amplifier.

2. The method of predistorting signals according to claim 1, further comprising the step of converting said second predistorted input signal, $x_{out\_LUT\_R}$, into an analog signal for input to the nonlinear power amplifier, thereby linearizing a response of the nonlinear power amplifier.

3. The method of predistorting signals according to claim 2, wherein the memory polynomial is synthesized based on observed power amplifier characteristics quantifying linearity performance of the nonlinear power amplifier.

4. The method of predistorting signals according to claim 2, wherein the look-up table function is synthesized based on observed power amplifier characteristics quantifying linearity performance of the nonlinear power amplifier.

5. The method of predistorting signals according to claim 2, wherein the signals comprise digital signals selected from the group consisting of digital baseband signals, digital intermediate frequency signals, and digital radio frequency signals.

6. The method of predistorting signals according to claim 2, wherein the signals comprise analog signals selected from the group consisting of analog baseband signals, analog intermediate frequency signals, and analog radio frequency signals.

* * * * *